United States Patent [19]
Kobatake

[11] Patent Number: 5,736,951
[45] Date of Patent: Apr. 7, 1998

[54] HIGH SPEED AND HIGH ACCURACY A/D CONVERTER

[75] Inventor: Hiroyuki Kobatake, Tokyo, Japan

[73] Assignee: NEC Corporation, Tokyo, Japan

[21] Appl. No.: 696,601

[22] Filed: Aug. 14, 1996

[30] Foreign Application Priority Data

Aug. 14, 1995 [JP] Japan ............... 7-228568

[51] Int. Cl.$^6$ .................................. H03M 1/36
[52] U.S. Cl. .................. 341/159; 341/158; 341/115; 341/118; 341/119; 341/120; 341/121; 307/18; 307/19; 307/25; 307/28
[58] Field of Search ............... 341/118–121, 115, 341/158, 159; 361/42–50; 326/33, 80; 307/18, 19, 25, 28; 327/52–56, 310, 317, 549, 551

[56] References Cited

U.S. PATENT DOCUMENTS

| | | | |
|---|---|---|---|
| 5,006,852 | 4/1991 | Goto et al. | 341/155 |
| 5,237,213 | 8/1993 | Tanoi | 327/379 |
| 5,274,280 | 12/1993 | Ito et al. | 327/530 |

*Primary Examiner*—Fritz Fleming
*Assistant Examiner*—Jason L. W. Kost
*Attorney, Agent, or Firm*—Young & Thompson

[57] ABSTRACT

An analog-to-digital converter comprises the following elements. A reference voltage generation circuit is provided for dividing a reference voltage into a plurality of divided reference voltages having voltage levels different from each other. A plurality of comparators are provided, each of which has a first input terminal connected to an analog input line for fetching analog signals and a second input terminal connected to the reference voltage generation circuit for fetching a corresponding one of the divided reference voltages so as to compare the analog signals with the divided reference voltage. Each of the comparators has an output terminal through which an output digital signal is outputted. The comparators are connected to any one of a plurality of pairs of different power supply lines and different ground lines, wherein the different power supply lines are separated from each other as well as the different ground lines are separated from each other so that no interference between the different power supply lines and between the different ground lines appears through any noise generated on any of the comparators. A decoder circuit is connected to the output terminals of the comparators for fetching the compared digital signals and decoding the compared digital signals.

2 Claims, 7 Drawing Sheets

HIGH SPEED AND HIGH ACCURACY A/D CONVERTER

BACKGROUND OF THE INVENTION

The present invention relates to an analog-to-digital converter, and more particularly to a high speed and high accuracy analog-to-digital converter, wherein a digital signal is derived from an output obtained by comparing a reference voltage to an analog input voltage.

Figure 1:
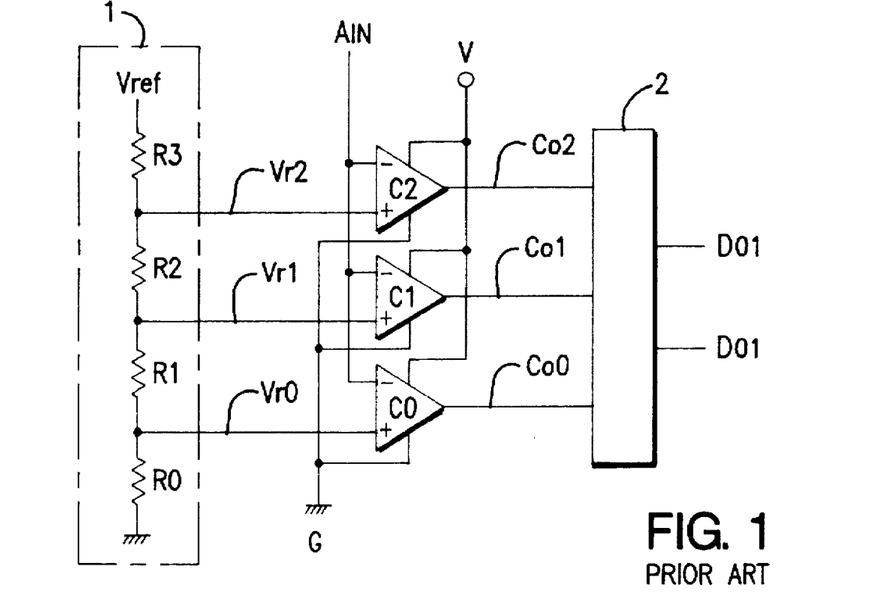
FIG. 1 is a circuit diagram illustrative of the conventional analog-to-digital converter.

In the prior art, such are analog-to-digital converter has a circuit configuration as illustrated in FIG. 1. The analog-to-digital converter has a reference voltage generation circuit 1 which comprises first to fourth resistors R0, R1, R2 and R3 which are connected in series between a reference voltage line and a ground line so that the reference voltage Vref is divided to generate three different voltages Vr0, Vr1 and Vr2. The analog-to-digital converter also has first to third comparators C0, C1 and C2 which are biased between a high voltage V and a ground line G. The first comparator C0 has a positive input terminal which is connected to an intermediate between the resistances R0 and R1 so as to fetch the voltage Vr0 and a negative input terminal which is connected to an analog input line Ain so as to fetch the analog input signal for comparison of the fetched voltage Vr0 to the analog input signal. The second comparator C1 has a positive input terminal which is connected to an intermediate between the resistances R1 and R2 so as to fetch the voltage Vr1 and a negative input terminal which is connected to the analog input line Ain so as to fetch the analog input signal for comparison of the fetched voltage Vr1 to the analog input signal. The third comparator C2 has a positive input terminal which is connected to an intermediate between the resistances R2 and R3 so as to fetch the voltage Vr2 and a negative input terminal which is connected to the analog input line Ain so as to fetch the analog input signal for comparison of the fetched voltage Vr2 to the analog input signal. The analog-to-digital converter also has an encoder 2 which is connected to output terminals of the first to third comparators C0, C1 and C2 to fetch compared output signals Co0, Co1 and Co2 from the first, second and third comparators C0, C1 and C2 for encoding the compared output signals Co0, Co1 and Co2 into digital signals Do0 and Do1.

Figure 3A:
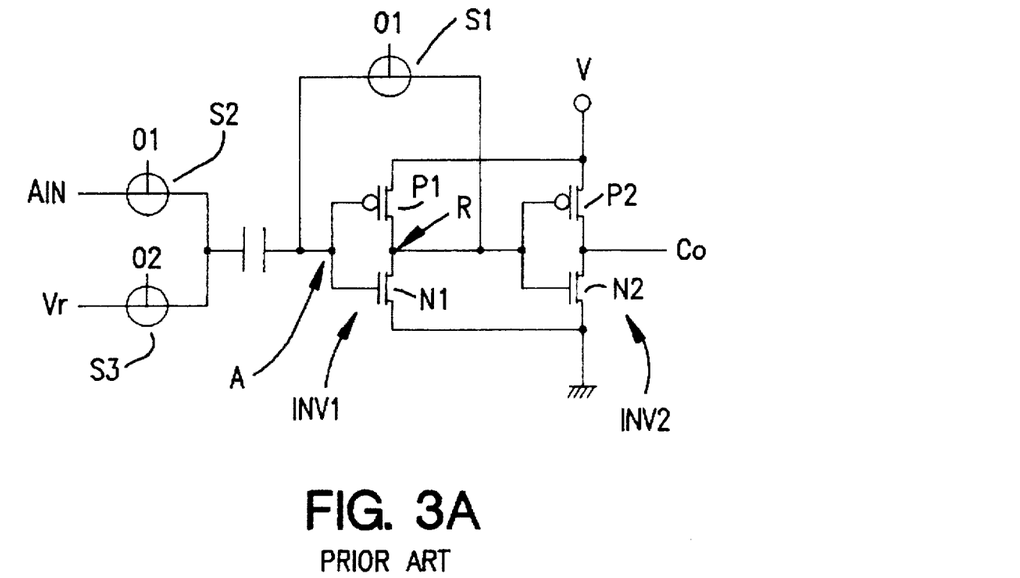
FIG. 3A is a circuit diagram illustrative of the comparator provided in the conventional analog-to-digital converter.

Each of the first to third comparators C0, C1 and C2 has a circuit configuration as illustrated in FIG. 3A. The comparator comprises first and second inventors INV1 and INV2, first, second and third transfer gates S1, S2 and S3 and a first terminal of a capacitor C. The second invertor INV2 has an output side which is connected to the output terminal of the comparator and an input side which is connected to an output terminal of the first invertor INV1. The second invertor INV2 is biased between a power supply line V and a ground line G. The first invertor has the output side which is connected to the input side of the second invertor INV2 and the first terminal of the capacitor C. The first invertor INV1 is biased between the power supply line V and the ground line G. The first transfer gate S1 is connected to the output and input sides of the first invertor INV1. A second terminal of the capacitor C is connected via the second transfer gate S2 to the analog input line Ain. The second terminal of the capacitor C is also connected via the third transfer gate S3 to the reference voltage line Vr. The first invertor INV1 comprises a first p-channel MOS field effect transistor P1 and a first n-channel MOS field effect transistor N1, both of which are connected in series between the power supply line and the ground line. The first p-channel MOS field effect transistor P1 has a source which is connected to the power supply line, a drain which is connected to the input side of the second invertor INV2 and a gate which is connected to the capacitor C. The first n-channel MOS field effect transistor N1 has a source which is connected to the ground line, a drain which is connected to the input side of the second invertor INV2 and a gate which is connected to the capacitor C. The second p-channel MOS field effect transistor P2 has a source which is connected to the power supply line, a drain which is connected to the input terminal of the comparator and a gate which is connected to the output side of the first invertor INV1. The second n-channel MOS field effect transistor N2 has a source which is connected to the ground line, a drain which is connected to the input terminal of the comparator and a gate which is connected to the output side of the first invertor INV1.

Figure 3B:
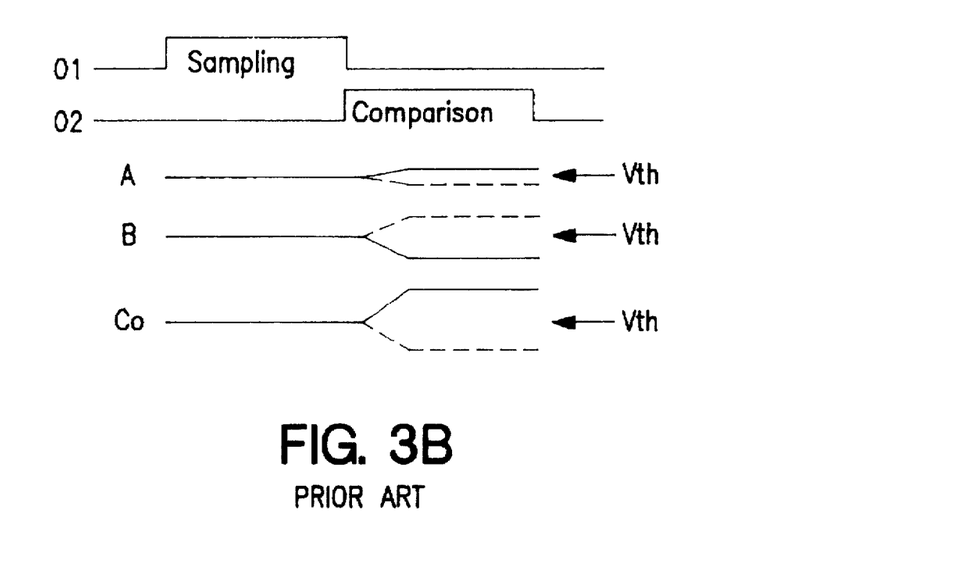
FIG. 3B is a timing chart illustrative of a voltage Ø 1 applied to the first and second transfer gates S1 and S2, a voltage Ø 2 applied to the third transfer gate S3, a voltage of a node "A" between the gates of the first p-channel and first n-channel MOS field effect transistors P1 and N1, a voltage of a node "B" between the drains of the first p-channel and first n-channel MOS field effect transistors P1 and N1, and an output voltage Co of the comparator.

FIG. 3B is a timing chart illustrative of a voltage $\emptyset$ 1 applied to the first and second transfer gates S1 and S2, a voltage $\emptyset$ 2 applied to the third transfer gate S3, a voltage of a node "A" between the gates of the first p-channel and first n-channel MOS field effect transistors P1 and N1, a voltage of a node "B" between the drains of the first p-channel and first n-channel MOS field effect transistors P1 and N1, and an output voltage Co of the comparator.

In the sampling period, the voltage $\emptyset$ 1 applied to the first and second transfer gates S1 and S2 has a high level whilst the voltage $\emptyset$ 2 applied to the third transfer gate S3 has a low level. The first and second transfer gates are made open whereby the nodes "A" and "B" become conductive. For this reason, the nodes "A" and "B" are biased at a theoretical threshold voltage Vth of the first invertor INV1. The output of the comparator is also biased at the theoretical threshold voltage Vth of the first invertor INV1. Since the capacitor C is applied with the analog signal, the capacitor C is biased at a subtraction of the theoretical threshold voltage Vth from the voltage of the analog signal. Thus, the capacitor is charged with a charge of the product of a capacitance and the subtraction of the theoretical threshold voltage Vth from the voltage of the analog signal. When the sampling period is terminated, the voltage $\emptyset$ 1 applied to the first and second transfer gates S1 and S2 is made into the low level so that the charge is stored in the capacitor C.

A comparison period follows the above sampling period. If it enters into the comparison period, the voltage $\emptyset$ 1 applied to the first and second transfer gates S1 and S2 has the low level whilst the voltage $\emptyset$ 2 applied to the third transfer gate S3 has the high level. The capacitor C is applied with the reference voltage Vr, wherein the capacitor C has stored the above charge. If the voltage of the analog input signal is lower than the reference voltage Vr, then the voltage represented by the real line of the node "A" is higher than the theoretical threshold voltage Vth. For which reason, the node "B" is inverted and amplified so that the voltage of the node "B" is made lower than the theoretical threshold voltage Vth. As a result, the output terminal of the comparator becomes high. If, however, the voltage of the analog input signal is higher than the reference voltage Vr, then the voltage represented by the real line of the node "A" is lower than the theoretical threshold voltage Vth. For which reason, the node "B" is inverted and amplified so that the voltage of the node "B" is made higher than the theoretical threshold voltage Vth. As a result, the output terminal of the comparator becomes low.

Figure 4:
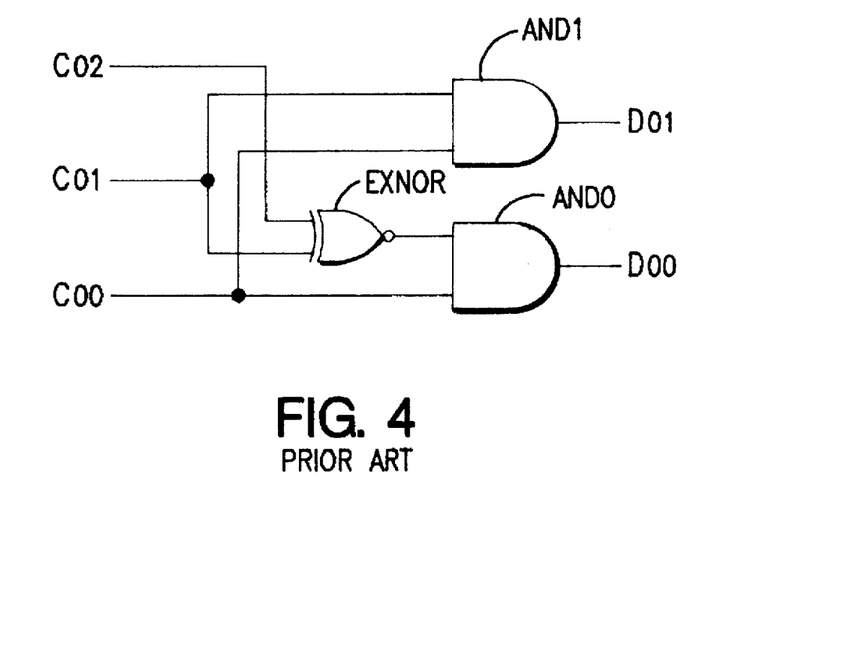
FIG. 4 is a circuit diagram illustrative of the decoder provided in the conventional analog-to-digital converter.

The encoder 2 has a circuit configuration as illustrated in FIG. 4. The encoder 2 comprises an EXNOR gate "EXNOR", first and second AND gates "AND1" and "AND2". The EXNOR gate "EXNOR" has two input terminals, one of which is connected to the output side of the third comparator C2 and another is connected to the output terminal of the second comparator C1 so as to fetch the second and third output signals Co1 and Co2 from the second the third comparators C1 and C2. The first AND gate "AND0" has two input terminals, one of which is connected to the output terminal of the first comparator C0 and another is connected to the output terminal of the EXNOR gate "EXNOR" so as to fetch the output signals from the first comparator C0 and the EXNOR gate "EXNOR". The second AND gate "AND1" has two input terminals, one of which is connected to the output side of the second comparator C1 and another is connected to the output terminal of the first comparator C0 so as to fetch the first and second output signals Co0 and Co1 from the first and second comparators C1 and C2. The relationship between the output signals Co0, Co1 and Co2 and output signals Do0 and Do1 are as illustrated in the following table of truth value.

TABLE OF TRUTH VALUE (with error)

| Co0 | Co1 | Co2 | Do0 | Do1 | Note |
|---|---|---|---|---|---|
| 0 | 0 | 0 | 0 | 0 | (Correct) |
| 1 | 0 | 0 | 1 | 0 | (Correct) |
| 1 | 1 | 0 | 0 | 1 | (Correct) |
| 1 | 0 | 1 | 0 | 0 | (Error) |
| 1 | 1 | 1 | 1 | 1 | (Correct) |

Figure 2:
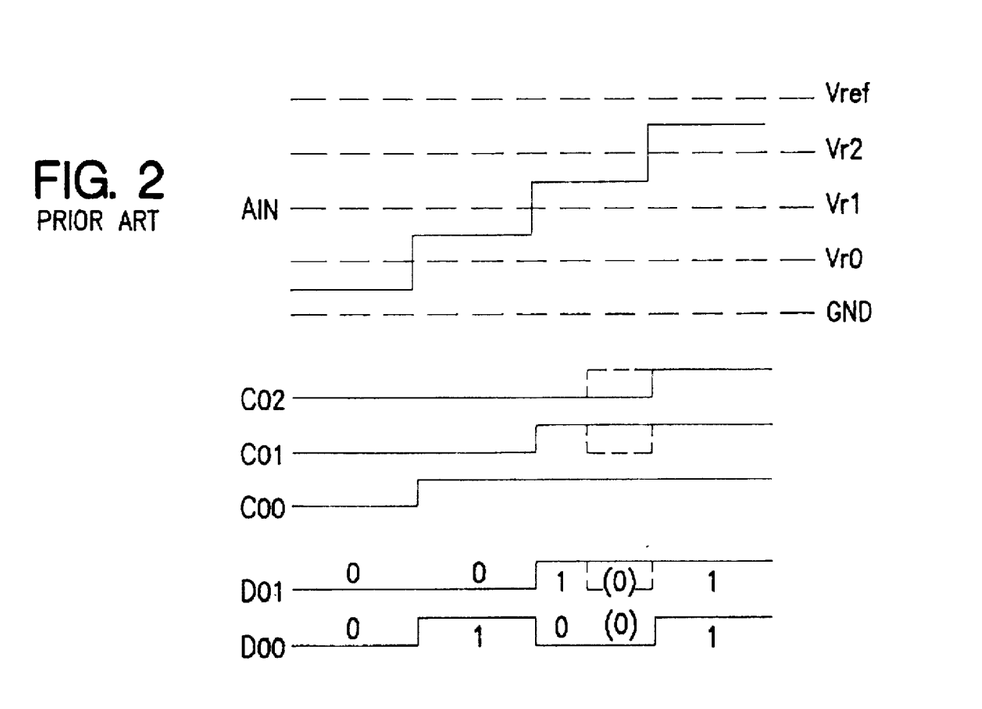
FIG. 2 is a timing chart illustrative of waveforms of the analog input signal Ain, the first, second and third output signals Co0, Co1 and Co2 of the first, second and third comparators C0, C1 and C2 and the output signals Do0 and Do1 of the decoder 2.

The above conventional analog-to-digital converter operates as follows. FIG. 2 which is a timing chart illustrative of the analog input signal Ain, file first, second and third output signals Co0, Co1 and Co2 of the first, second and third comparators C0, C1 and C2 and the output signals Do0 and Do1 of the decoder 2.

If the voltage level of the analog signal Ain is higher than the ground level GND but lower than the first reference voltage Vr0 obtained from the intermediate between the first and second resistances R0 and R1, then the first, second and third output signals Co0, Co1 and Co2 of the first, second and third comparators C0, C1 and C2 are at the low level "0". As a result, the output signals Do0 and Do1 of the decoder 2 are also at the low level "0".

If the voltage level of the analog signal Ain is higher than the first reference voltage Vr0 but lower than the second reference voltage Vr1 obtained from the intermediate between the second and third resistances R1 and R2, then the first output signal Co0 of the first comparator C0 is at the high level, whilst the second and third output signals Co1 and Co2 of the second and third comparators C1 and C2 remain at the low level "0". As a result, the output signal Do0 of the decoder 2 is at the high level "1" whilst the output signal Do1 of the decoder 2 remains at the low level "0".

If the voltage level of the analog signal Ain is higher than the second reference voltage Vr1 but lower than the third reference voltage Vr2 obtained from the intermediate between the third and fourth resistances R2 and R3, the first and second output signals Co0 and Co1 of the first and second comparators C0 and C1 may be at the high level whilst the third output signal Co2 of the third comparator C2 remains at the low level "0". As a result, the output signal Do0 of the decoder 2 is at the low level "0" whilst the output signal Do1 of the decoder 2 remains at the high level "1".

If the voltage level of the analog signal Ain is higher than the second reference voltage Vr2 but lower than the third reference voltage Vref, then the first, second and third output signals Co0, Co1 and Co2 of the first, second and third comparators C0, C1 and C2 are at the high level. As a result, the output signals Do0 and Do1 of the decoder 2 are at the high level "1".

Figure 5:
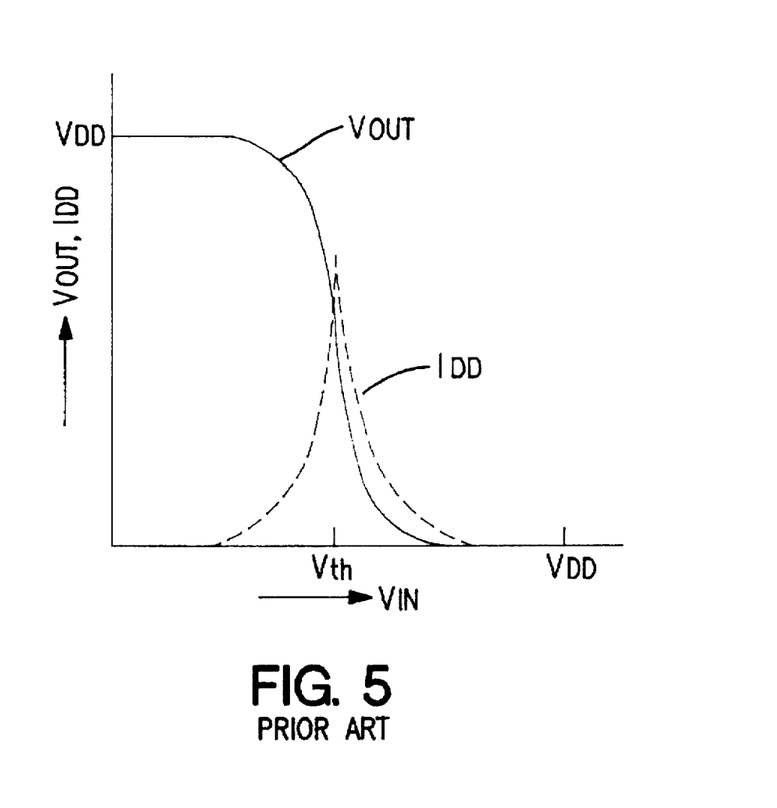
FIG. 5 is a diagram illustrative of properties of output voltage "Vout" and punch through currents Idd of the first and second invertors INV1 and INV2 provided in the comparator provided in the conventional analog-to-digital converter.

The above described analog-to-digital converter has the following problems. If the sampling period is terminated and it enters into the comparison period and thereby the voltages of the nodes "A" and "B" are changed from the threshold voltage Vth into either the high or low level, the first and second invertors INV1 and INV2 show properties of output voltage "Vout" and punch through currents Idd as illustrated in FIG. 5. The output voltage Vout is rapidly dropped from the voltage Vdd to the zero voltage when the input voltage Vin is around the threshold voltage Vth. The punch through current Idd has a sharp peak at the threshold voltage Vth as the input voltage Vin. The punch through current Idd means a current flowing from the power supply line through the second n-channel and second p-channel MOS field effect transistors N2 and P2 to the ground line GND. The rapid drop of the punch through current Idd causes noises of the power supply line and the ground line.

If the input side of the inverter is applied with a voltage in the vicinity of the threshold voltage Vth, then a difference between the analog input voltage Ain and the reference voltage Vr is extremely small, for which reason slight fluctuations on the input signals of the comparator causes a large variation in output voltage of the comparator as well as a large variation in punch through voltage thereof. This means that the comparator is likely to receive a large efficiency amount of the noise. Further, that means that the comparator is placed in a state where noises are likely to appear on the power supply line and the ground line due to the rapid variation in the punch through current Idd of the inverter.

If, therefore, the voltage level of the analog signal Ain is higher than the second reference voltage Vr1 but lower than the third reference voltage Vr2 obtained from the intermediate between the third and fourth resistances R2 and R3, the first and second output signals Co0 and Co1 of the first and second comparators C0 and C1 may be at the high level "1", whilst the third output signal Co2 of the third comparator C2 remains at the low level "0". As a result, theoretically, the output signal Do0 of the decoder 2 should be at the low level "0" whilst the output signal Do1 of the decoder 2 should remain at the high level "1". Notwithstanding, actually, the analog input signal has a voltage level which differs by small levels from the reference voltages Vr1 and Vr2 inputted into the second and third comparators C1 and C2, for which reason the comparator is placed in an unstable state where noises are likely to appear and the comparator is likely to be affected by the noises.

In addition, since the first, second and third comparators C0, C1 and C2 are connected to the common power supply line and the common ground line, an interference appears through the noise on the power supply line and the ground line between the second and third comparators C1 and C2 whereby it may be possible that both the output signals Do0 and Do1 of the decoder 2 are at the low level "0" by error. More precisely, the output signal Do1 is at the low level "0" by error. This means the conventional analog-to-digital converter has no reliability on accuracy of the output digital signals.

In the above circumstances, there has been required a development of an improved analog-to-digital converter which is capable of preventing the interference of the comparator which is inputted with the analog input signal slightly different from the reference voltage to obtain a high accuracy of the conversion operation free of any error on output signal.

SUMMARY OF THE INVENTION

Accordingly, it is an object of the present invention to provide an improved analog-to-digital converter free from any problems or disadvantages as described above.

It is a further object of the present invention to provide an improved analog-to-digital converter which is capable of preventing the interference of the comparator which are inputted when the analog input signal is slightly different from the reference voltage.

It is a still further object of the present invention to provide an improved analog-to-digital converter which has a high accuracy of the conversion operation free of any error in the output signal.

It is yet a further object of the present invention to provide an improved analog-to-digital converter which has a high speed performance.

The above and other objects, features and advantages of the present invention will be apparent from the following descriptions.

The present invention provides an analog-to-digital converter comprising the following elements. A reference voltage generation circuit is provided for dividing a reference voltage into a plurality of divided reference voltages having voltage levels different from each other. A plurality of comparators is provided, each of which has a first input terminal connected to an analog input line for fetching analog signals and a second input terminal connected to the reference voltage generation circuit for fetching a corresponding one of the divided reference voltages so as to compare the analog signals with the divided reference voltage. Each of the comparators has an output terminal through which a compared digital signal is outputted. The comparators are connected to any one of a plurality of pairs of different power supply lines and different ground lines. A decoder circuit is connected to the output terminals of the comparators for fetching the compared digital signals and decoding the compared digital signals. It is essential that the different power supply lines are separated from each other as well as the different ground lines are separated from each other so that no interference between the different power supply lines and between the different ground lines appears through any noise generated on any of the comparators.

It is preferable that there are provided the same number of the pairs of the different power supply lines and the different ground lines as the comparators so that the comparators are connected to different pairs of the power supply lines and different ground lines.

It is also preferable that there are provided two pairs of the different power supply lines and the different ground lines so that the comparators are alternatively connected to the two pairs of the different power supply lines and the different ground lines.

BRIEF DESCRIPTIONS OF THE DRAWINGS

Preferred embodiments according to the present invention will be described in detail with reference to the accompanying drawing.

PREFERRED EMBODIMENTS

A first embodiment according to the present invention will be described in detail with reference to FIGS. 6 through 10, wherein there will be provided an improved analog-to-digital converter which is capable of preventing an interference of a comparator which is inputted with an analog input signal slightly different from a reference voltage to obtain a high accuracy of a conversion operation free of any error in the output signal.

Figure 6:
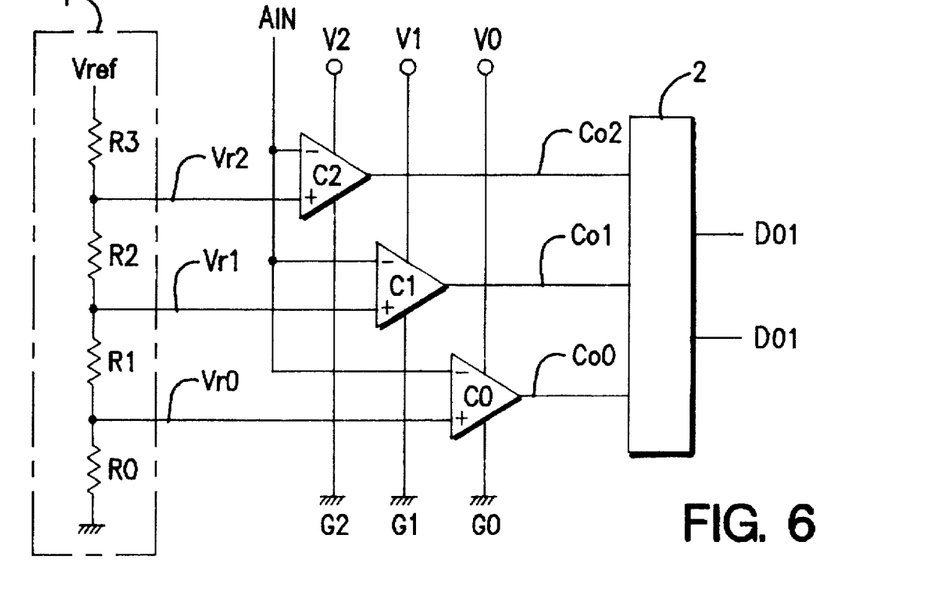
FIG. 6 is a circuit diagram illustrative of an improved analog-to-digital converter in a first embodiment in accordance with the present invention.

FIG. 6 is a circuit diagram illustrative of an improved analog-to-digital converter in a first embodiment in accordance with the present invention.

The improved analog-to-digital converter has a reference voltage generation circuit 1 which comprises first to fourth resistors R0, R1, R2 and R3 which are connected in series between a reference voltage line and a ground line so that the reference voltage Vref is divided to generate three different voltages Vr0, Vr1 and Vr2. The improved analog-to-digital converter also has first to third comparators C0, C1 and C2 which are biased by a difference between a high voltage level V and a ground level G, but are connected between different pairs of power supply lines and ground lines. The first comparator C0 has a positive input terminal which is connected to an intermediate between the resistances R0 and R1 so as to fetch the voltage Vr0 and a negative input terminal which is connected to an analog input line Ain so as to fetch the analog input signal for comparison of the fetched voltage Vr0 to the analog input signal. The first comparator C0 is biased between a first power supply line V0 and a first ground line G0. The second comparator C1 has a positive input terminal which is connected to an intermediate between the resistances R1 and R2 so as to fetch the voltage Vr1 and a negative input terminal which is connected to the analog input line Ain so as to fetch the analog input signal for comparison of the fetched voltage Vr1 to the analog input signal. The second comparator C1 is biased between a second power supply line V1 separated from the first power supply line V0 and a second ground line G1 separated from the first ground line G0. The third comparator C2 has a positive input terminal which is connected to an intermediate between the resistances R2 and R3 so as to fetch the voltage Vr2 and a negative input terminal which is connected to the analog input line Ain so as to fetch the analog input signal for comparison of the fetched voltage Vr2 to the analog input signal. The third comparator C2 is biased between a third power supply line V2 separated from the second power supply line V1 and a third ground line G2 separated from the second ground line G1. The analog-to-digital converter also has an encoder 2 which is connected to output terminals of the first to third comparators C0, C1 and C2 to fetch compared output signals Co0, Co1 and Co2 from the first, second and third comparators C0, C1 and C2 for encoding the compared output signals Co0, Co1 and Co2 into digital signals Do0 and Do1.

Figure 8A:
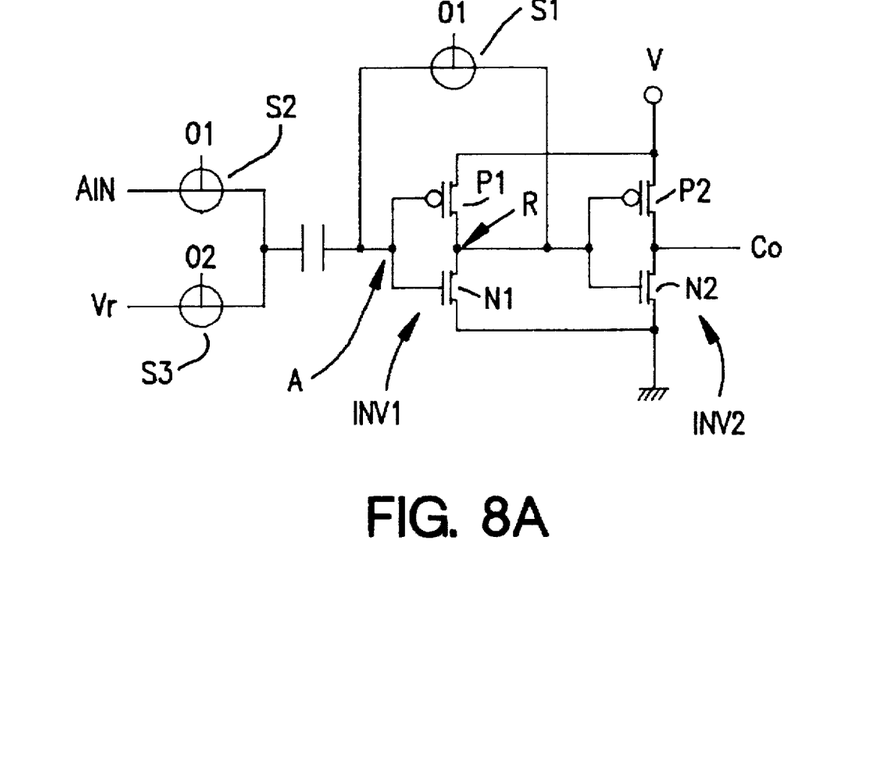
FIG. 8A is a circuit diagram illustrative of a comparator provided in an improved analog-to-digital converter in a first embodiment in accordance with the present invention.

Each of the first to third comparators C0, C1 and C2 has a circuit configuration as illustrated in FIG. 8A. As described above, the first comparator C0 is biased between the first power supply line V0 and the first ground line G0. The second comparator C1 is biased between the second power supply line V1 separated from the first power supply line V0 and the second ground line G1 separated from the first ground line G0. The third comparator C2 is biased between the third power supply line V2 separated from the second power supply line V1 and the third ground line G2 separated from the second ground line G1.

The comparator comprises first and second inventors INV1 and INV2, first, second and third transfer gates S1, S2 and S3 and a first terminal of a capacitor C. The second invertor INV2 has an output side which is connected to the output terminal of the comparator and an input side which is connected to an output terminal of the first invertor INV1. The second invertor INV2 is biased between a power supply line V and a ground line G. Namely, the second invertor INV2 provided in the first comparator C0 is biased between the first power supply line V0 and the first ground line G0. The second invertor INV2 provided in the second comparator C1 is biased between the second power supply line V1 separated from the first power supply line V0 and the second ground line G1 separated from the first ground line G0. The second invertor INV2 provided in the third comparator C2 is biased between the third power supply line V2 separated from the second power supply line V1 and the third ground line G2 separated from the second ground line G1.

The first invertor INV1 has the output side which is connected to the input side of the second invertor INV2 and the first terminal of the capacitor C. The first invertor INV1 is biased between the power supply line V and the ground line G. Namely, the first invertor INV1 provided in the first comparator C0 is biased between the first power supply line V0 and the first ground line G0. The first invertor INV1 provided in the second comparator C1 is biased between the second power supply line V1 separated from the first power supply line V0 and the second ground line G1 separated from the first ground line G0. The first invertor INV1 provided in the third comparator C2 is biased between the third power supply line V2 separated from the second power supply line V1 and the third ground line G2 separated from the second ground line G1.

The first transfer gate S1 is connected to the output and input sides of the first invertor INV1. A second terminal of the capacitor C is connected via the second transfer gate S2 to the analog input line Ain. The second terminal of the capacitor C is also connected via the third transfer gate S3 to the reference voltage line Vr.

The first invertor INV1 provided in the first comparator C0 comprises a first p-channel MOS field effect transistor P1 and a first n-channel MOS field effect transistor N1, both of which are connected in series between the first power supply line V0 and the first ground line G0. The first p-channel MOS field effect transistor P1 has a source which is connected to the first power supply line V0, a drain which is connected to the input side of the second invertor INV2 and a gate which is connected to the capacitor C. The first n-channel MOS field effect transistor N1 has a source which is connected to the first ground line G0, a drain which is connected to the input side of the second invertor INV2 and a gate which is connected to the capacitor C. The second p-channel MOS field effect transistor P2 has a source which is connected to the first power supply line V0, a drain which is connected to the input terminal of the comparator and a gate which is connected to the output side of the first invertor INV1. The second n-channel MOS field effect transistor N2 has a source which is connected to the first ground line G0, a drain which is connected to the input terminal of the comparator and a gate which is connected to the output side of the first invertor INV1.

The first invertor INV1 provided in the second comparator C0 also comprises a first p-channel MOS field effect transistor P1 and a first n-channel MOS field effect transistor N1, both of which are connected in series between the second power supply line V1 and the second ground line G1. The first p-channel MOS field effect transistor P1 has a source which is connected to the second power supply line V1, a drain which is connected to the input side of the second invertor INV2 and a gate which is connected to the capacitor C. The first n-channel MOS field effect transistor N1 has a source which is connected to the second ground line G1, a drain which is connected to the input side of the second invertor INV2 and a gate which is connected to the capacitor C. The second p-channel MOS field effect transistor P2 has a source which is connected to the second power supply line V1, a drain which is connected to the input terminal of the comparator and a gate which is connected to the output side of the first invertor INV1. The second n-channel MOS field effect transistor N2 has a source which is connected to the second ground line G1, a drain which is connected to the input terminal of the comparator and a gate which is connected to the output side of the first invertor INV1.

The first invertor INV1 provided in the third comparator C0 also comprises a first p-channel MOS field effect transistor P1 and a first n-channel MOS field effect transistor N1, both of which are connected in series between the third power supply line V2 and the third ground line G2. The first p-channel MOS field effect transistor P1 has a source which is connected to the third power supply line V2, a drain which is connected to the input side of the second invertor INV2 and a gate which is connected to the capacitor C. The first n-channel MOS field effect transistor N1 has a source which is connected to the third ground line G2, a drain which is connected to the input side of the second invertor INV2 and a gate which is connected to the capacitor C. The second p-channel MOS field effect transistor P2 has a source which is connected to the third power supply line V2, a drain which is connected to the input terminal of the comparator and a gate which is connected to the output side of the first invertor INV1. The second n-channel MOS field effect transistor N2 has a source which is connected to the third ground line G2, a drain which is connected to the input terminal of the comparator and a gate which is connected to the output side of the first invertor INV1.

Figure 8B:
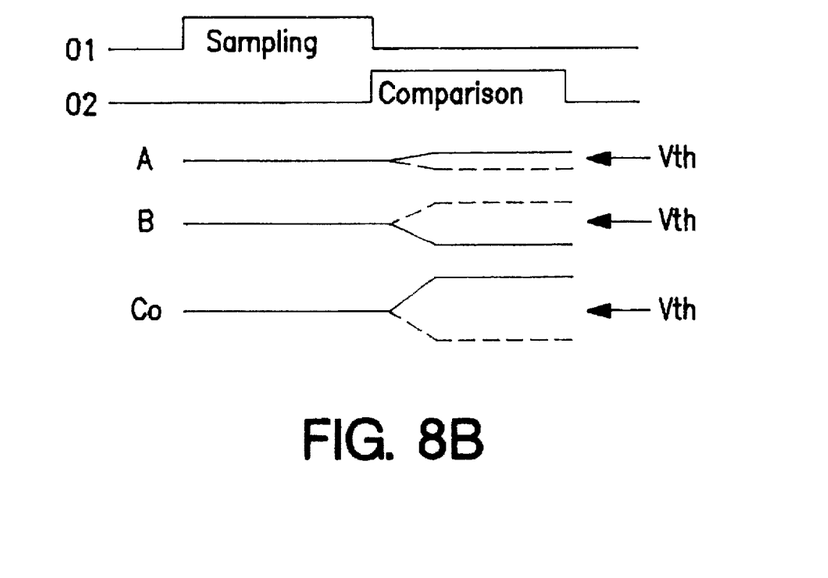
FIG. 8B is a timing chart illustrative of a voltage Ø 1 applied to first and second transfer gates S1 and S2, a voltage Ø 2 applied to a third transfer gate S3, a voltage of a node "A" between gates of first p-channel and first n-channel MOS field effect transistors P1 and N1, a voltage of a node "B" between drains of first p-channel and first n-channel MOS field effect transistors P1 and N1, and an output voltage Co of a comparator in a first embodiment in accordance with the present invention.

FIG. 8B is a timing chart illustrative of a voltage Ø 1 applied to the first and second transfer gates S1 and S2, a voltage Ø 2 applied to the third transfer gate S3, a voltage of a node "A" between the gates of the first p-channel and first n-channel MOS field effect transistors P1 and N1, a voltage of a node "B" between the drains of the first p-channel and first n-channel MOS field effect transistors P1 and N1, and an output voltage Co of the comparator.

In the sampling period, the voltage Ø 1 applied to the first and second transfer gates S1 and S2 has a high level whilst the voltage Ø 2 applied to the third transfer gate S3 has a low level. The first and second transfer gates are made open whereby the nodes "A" and "B" becomes conductive. For this reason, the nodes "A" and "B" are biased at a theoretical threshold voltage Vth of the first invertor INV1. The output of the comparator is also biased at the theoretical threshold voltage Vth of the first invertor INV1. Since the capacitor C is applied with the analog signal, the capacitor C is biased at a subtraction of the theoretical threshold voltage Vth from the voltage of the analog signal. Thus, the capacitor is charged with a charge of the product of a capacitance and the subtraction of the theoretical threshold voltage Vth from the voltage of the analog signal. When the sampling period is terminated, the voltage Ø 1 applied to the first and second transfer gates S1 and S2 is made into the low level so that the charge is stored in the capacitor C.

A comparison period follows the above sampling period. If it enters into the comparison period, the voltage Ø 1 applied to the first and second transfer gates S1 and S2 has the low level whilst the voltage Ø 2 applied to the third transfer gate S3 has the high level. The capacitor C is applied with the reference voltage Vr, wherein the capacitor C has stored the above charge. If the voltage of the analog input signal is lower than the reference voltage Vr, then the voltage represented by the real line of the node "A" is higher than the theoretical threshold voltage Vth. For which reason, the node "B" is inverted and amplified so that the voltage of the node "B" is made lower than the theoretical threshold voltage Vth. As a result, the output terminal of the comparator becomes high. If, however, the voltage of the analog input signal is higher than the reference voltage Vr, then the voltage represented by the real line of the node "A" is lower than the theoretical threshold voltage Vth. For which reason, the node "B" is inverted and amplified so that the voltage of the node "B" is made higher than the theoretical threshold voltage Vth. As a result, the output terminal of the comparator becomes low.

Figure 9:
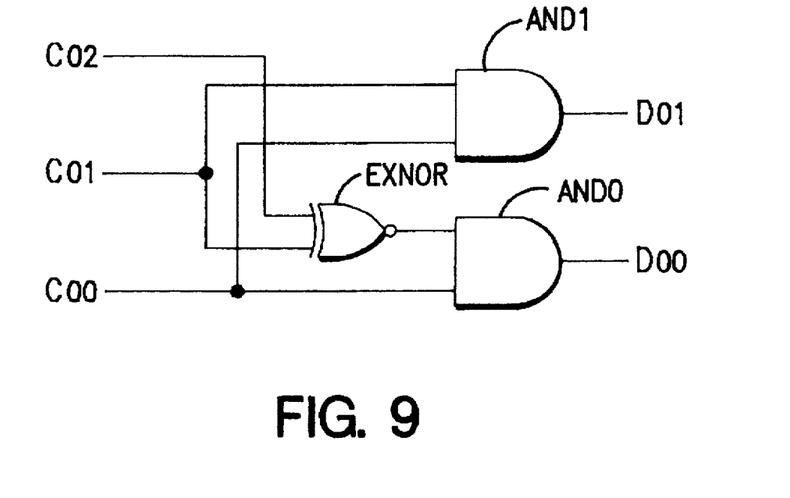
FIG. 9 is a circuit diagram illustrative of a decoder provided in an improved analog-to-digital converter in a first embodiment in accordance with the present invention.

The encoder 2 has a circuit configuration as illustrated in FIG. 9. The encoder 2 comprises an EXNOR gate "EXNOR", first and second AND gates "AND1" and "AND2". The EXNOR gate "EXNOR" has two input terminals, one of which is connected to the output side of the third comparator C2 and another is connected to the output terminal of the second comparator C1 so as to fetch the second and third output signals Co1 and Co2 from the second the third comparators C1 and C2. The first AND gate "AND0" has two input terminals, one of which is connected to the output terminal of the first comparator C0 and another is connected to the output terminal of the EXNOR gate "EXNOR" so as to fetch the output signals from the first comparator C0 and the EXNOR gate "EXNOR". The second AND gate "AND1" has two input terminals, one of which is connected to the output side of the second comparator C1 and another is connected to the output terminal of the first comparator C0 so as to fetch the first and second output signals Co0 and Co1 from the first and second comparators C1 and C2. The relationship between the output signals Co0, Co1 and Co2 and output signals Do0 and Do1 are as illustrated in the following table of truth value.

| TABLE OF TRUTH VALUE (free of error) | | | | | |
|---|---|---|---|---|---|
| Co0 | Co1 | Co2 | Do0 | Do1 | Note |
| 0 | 0 | 0 | 0 | 0 | (Correct) |
| 1 | 0 | 0 | 1 | 0 | (Correct) |
| 1 | 1 | 0 | 0 | 1 | (Correct) |
| 1 | 1 | 1 | 1 | 1 | (Correct) |

Figure 7:
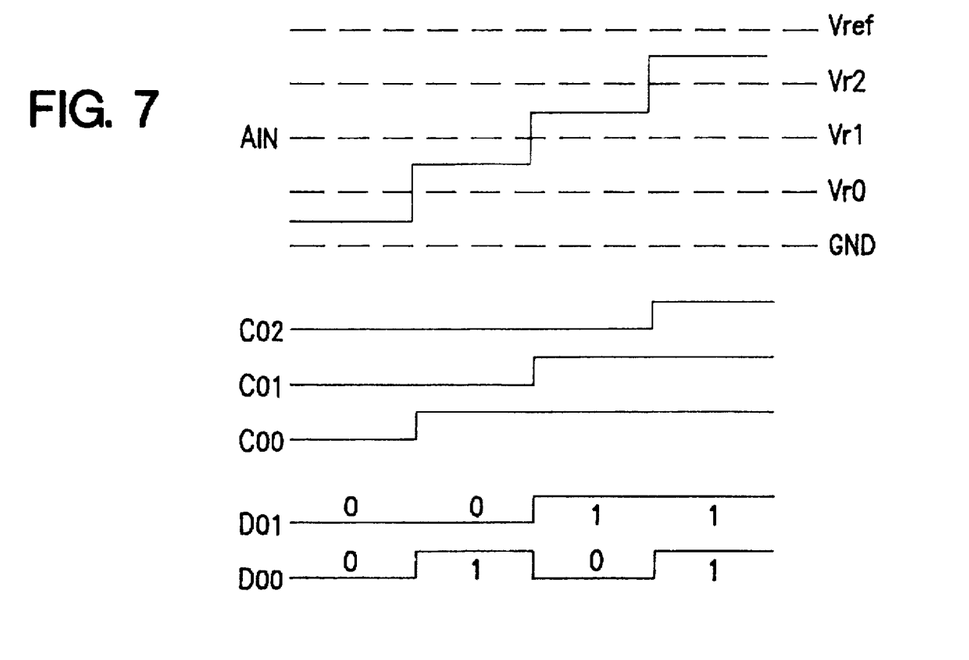
FIG. 7 is a timing chart illustrative of waveforms of an analog input signal Ain, first, second and third output signals Co0, Co1 and Co2 of first, second and third comparators C0, C1 and C2 and output signals Do0 and Do1 of decoder 2 in a first embodiment in accordance with the present invention.

The above analog-to-digital converter operates as follows. FIG. 7 is a timing chart illustrative of waveforms of an analog input signal Ain, first, second and third output signals Co0, Co1 and Co2 of first, second and third comparators C0, C1 and C2 and output signals Do0 and Do1 of decoder 2 in a first embodiment in accordance with the present invention.

If the voltage level of the analog signal Ain is higher than the ground level GND but lower than the first reference voltage Vr0 obtained from the intermediate between the first and second resistances R0 and R1, then the first, second and third output signals Co0, Co1 and Co2 of the first, second and third comparators C0, C1 and C2 are at the low level "0". As a result, the output signals Do0 and Do1 of the decoder 2 are also at the low level "0".

If the voltage level of the analog signal Ain is higher than the first reference voltage Vr0 but lower than the second reference voltage Vr1 obtained from the intermediate between the second and third resistances R1 and R2, then the first output signal Co0 of the first comparator C0 is at the high level, whilst the second and third output signals Co1 and Co2 of the second and third comparators C1 and C2 remain at the low level "0". As a result, the output signal Do0 of the decoder 2 is at the high level "1" whilst the output signal Do1 of the decoder 2 remains at the low level "0".

If the voltage level of the analog signal Ain is higher than the second reference voltage Vr1 but lower than the third reference voltage Vr2 obtained from the intermediate between the third and fourth resistances R2 and R3, the first and second output signals Co0 and Co1 of the first and second comparators C0 and C1 may be at the high level, whilst the third output signal Co2 of the third comparator C2 remains at the low level "0". As a result, the output signal Do0 of the decoder 2 is at the low level "0" whilst the output signal Do1 of the decoder 2 remains at the high level "1".

If the voltage level of the analog signal Ain is higher than the second reference voltage Vr2 but lower than the third reference voltage Vref, then the first, second and third output signals Co0, Co1 and Co2 of the first, second and third comparators C0, C1 and C2 are at the high level. As a result, the output signals Do0 and Do1 of the decoder 2 are at the high level "1".

Figure 10:
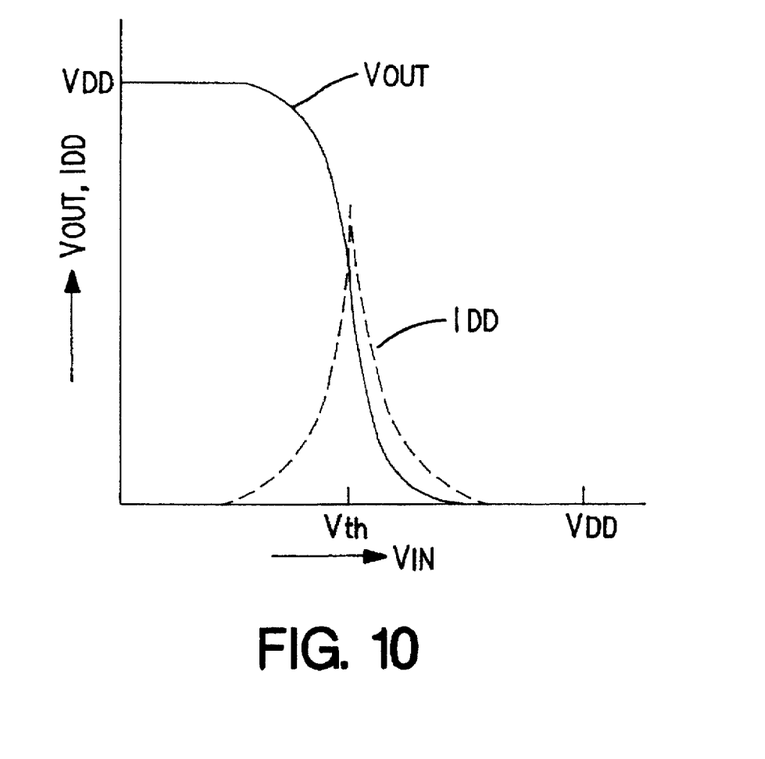
FIG. 10 is a diagram illustrative of properties of output voltage "Vout" and punch through currents Idd of first and second invertors INV1 and INV2 provided in a comparator provided in an improved analog-to-digital converter in a first embodiment in accordance with the present invention.

The above described analog-to-digital converter is free from the problems of the conventional analog-to-digital converter described above. If the sampling period is terminated and it enters into the comparison period and thereby the voltages of the nodes "A" and "B" are changed from the threshold voltage Vth into either the high or low level, the first and second invertors INV1 and INV2 show properties of output voltage "Vout" and punch through currents Idd as illustrated in FIG. 10. The output voltage Vout is rapidly dropped from the voltage Vdd to the zero voltage when the input voltage Vin is leveled around the threshold voltage Vth. The punch through current Idd has a sharp peak at the threshold voltage Vth as the input voltage Vin. The punch through current Idd means a current flowing from the power supply line through the second n-channel and second p-channel MOS field effect transistors N2 and P2 to the ground line GND. The rapid drop of the punch through current Idd causes noises of the power supply line and the ground line.

In any one of the first, second and third comparators C0, C1 and C2, if the input side of the invertor provided is applied with a voltage in the vicinity of the threshold voltage Vth, then a difference between the analog input voltage Ain and the reference voltage Vr is extremely small, for which reason slight fluctuations on the input signals of the comparator causes a large variation in output voltage of the comparator as well as a large variation in punch through voltage thereof. This means that the one of the first, second and third comparators C0, C1 and C2 is likely to receive a large amount of the noise. Further, that means that the one of the first, second and third comparators C0, C1 and C2 is placed in a state where noises are likely to appear on the corresponding power supply line and the corresponding ground line due to the rapid variation in the punch through current Idd of the invertor.

Even if the voltage level of the analog signal Ain is higher than the second reference voltage Vr1 but lower than the third reference voltage Vr2 obtained from the intermediate between the third and fourth resistances R2 and R3, the first and second output signals Co0 and Co1 of the first and second comparators C0 and C1 may be at the high level "1", whilst the third output signal Co2 of the third comparator C2 remains at the low level "0". As a result, theoretically, the output signal Do0 of the decoder 2 should be at the low level "0" whilst the output signal Do1 of the decoder 2 should remain at the high level "1". Notwithstanding, actually, the analog input signal has a voltage level which differs by small levels from the reference voltages Vr1 and Vr2 inputted into the second and third comparators C1 and C2, for which reason the comparator is placed in an unstable state where noises are likely to appear and the comparator is likely to be affected by the noises.

Since, however, the first, second and third comparators C0, C1 and C2 are connected to the different power supply lines V0, V1 and V2 and the different ground lines G-0, G1 and G2, any interference could never appear through the noise on the power supply line and the ground line between the second and third comparators C1 and C2 whereby it may be impossible that both the output signals Do0 and Do1 of the decoder 2 are at the low level "0" by error. More precisely, the output signal Do1 could never be at the low level "0" by error. This means the improved analog-to-digital converter has an accurate conversion performance free from any error and then has a certain reliability on accuracy of the output digital signals.

The above descriptions prove that the improved analog-to-digital converter in accordance with the present invention is capable of preventing any interference of the comparator which is inputted with the analog input signal slightly different from the reference voltage to obtain a high accuracy of the conversion operation free of any error on output signal.

A second embodiment according to the present invention will be described in detail with reference to FIG. 11, wherein there will be provided another improved analog-to-digital converter which is capable of preventing an interference of a comparator which is inputted with an analog input signal slightly different from a reference voltage to obtain a high accuracy of a conversion operation free of any error on output signal.

Figure 11:
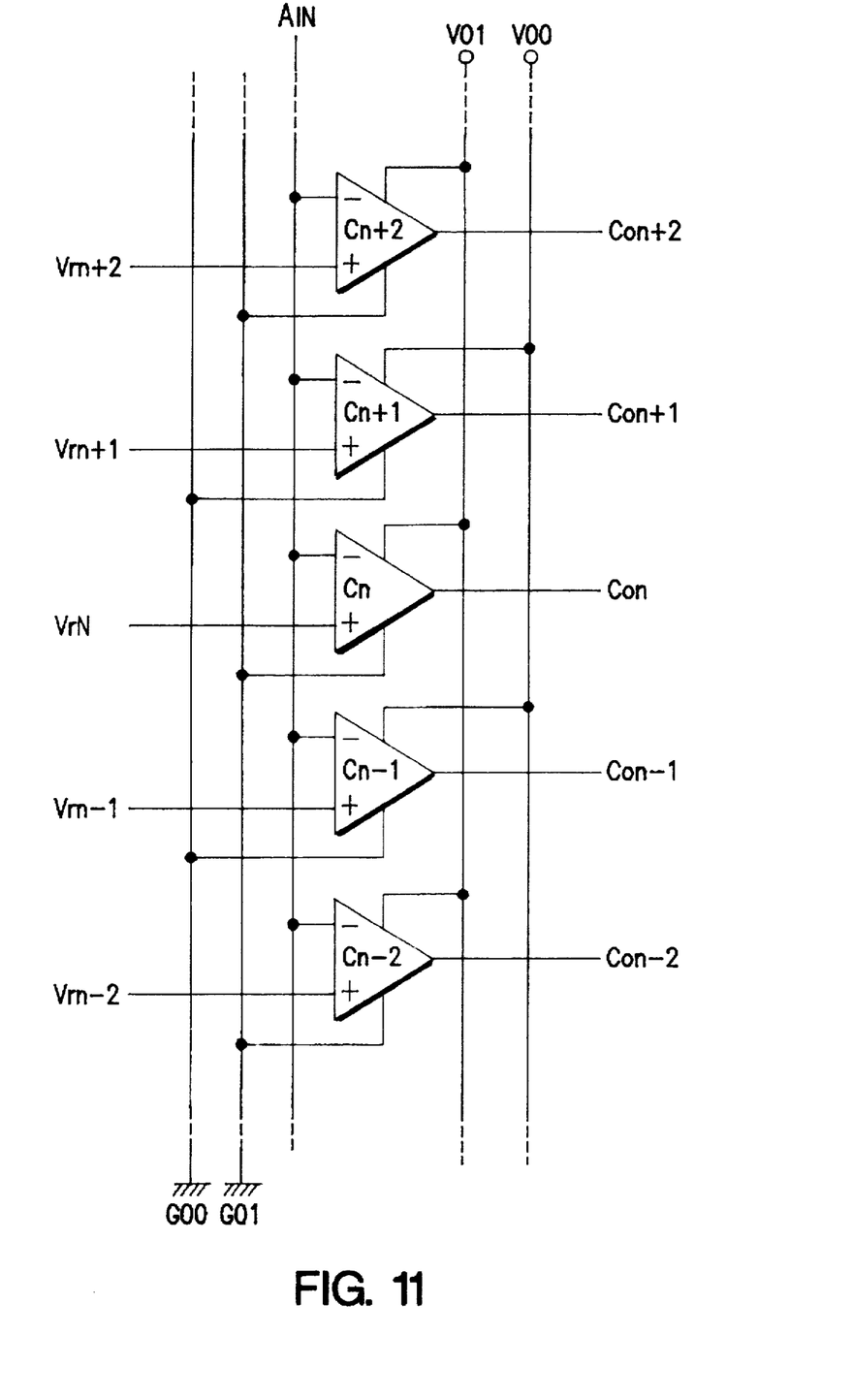
FIG. 11 is a circuit diagram illustrative of an improved analog-to-digital converter in a second embodiment in accordance with the present invention.

FIG. 11 is a circuit diagram illustrative of an improved analog-to-digital converter in a second embodiment in accordance with the present invention.

The improved analog-to-digital converter has a reference voltage generation circuit 1 which comprises a plurality of resistors which are connected in series between a reference voltage line and a ground line so that the reference voltage Vref is divided to generate a plurality of different voltages such as Vrn−2, Vrn−1, Vrn, Vrn+1 and Vrn+2. The improved analog-to-digital converter also has a plurality of comparators Cn−2, Cn−1, Cn, Cn+1 and Cn+2 which are biased by a difference between a high voltage level V and a ground level G, but are connected between different two pairs of power supply lines Vo0 and Vo1 and ground lines Go0 and Go1. The comparator Cn−2 has a positive input terminal which is connected to an intermediate between the resistances so as to fetch the voltage Vrn−2 and a negative input terminal which is connected to an analog input line Ain so as to fetch the analog input signal for comparison of the fetched voltage Vrn−2 to the analog input signal. The first comparator Cn−2 is biased between the second power supply line Vo1 and the second ground line Go1. The comparator Cn−1 has a positive input terminal which is connected to an intermediate between the resistances so as to fetch the voltage Vrn−1 and a negative input terminal which is connected to the analog input line Ain so as to fetch the analog input signal for comparison of the fetched voltage Vrn−1 to the analog input signal. The comparator Cn−1 is biased between the first power supply line Vo0 separated from the second power supply line Vo1 and the first ground line Go0 separated from the second ground line Go1. The comparator Cn has a positive input terminal which is connected to an intermediate between the resistances so as to fetch the voltage Vrn and a negative input terminal which is connected to the analog input line Ain so as to fetch the analog input signal for comparison of the fetched voltage Vrn to the analog input signal. The comparator Cn is biased between the second power supply line Vo1 and the second ground line Go1. The comparator Cn+1 has a positive input terminal which is connected to an intermediate between the resistances so as to fetch the voltage Vrn+1 and a negative input terminal which is connected to the analog input line Ain so as to fetch the analog input signal for comparison of the fetched voltage Vrn+1 to the analog input signal. The comparator Cn+1 is biased between the first power supply line Vo0 and the first ground line Go0. The comparator Cn+2 has a positive input terminal which is connected to an intermediate between the resistances so as to fetch the voltage Vrn+2 and a negative input terminal which is connected to the analog input line Ain so as to fetch the analog input signal for comparison of the fetched voltage Vrn+2 to the analog input signal. The comparator Cn+2 is biased between the second power supply line Vo1 and the second ground line Go1. The comparators Cn−2, Cn−1, Cn, Cn+1 and Cn+2 are alternatively connected to the first pair of the first power supply line Vo0 and the first ground line Go0 and to the second pair of the second power supply line Vo1 and the second ground line Go1.

The analog-to-digital converter also has an encoder which is connected to output terminals of the comparators Cn−2, Cn−1, Cn, Cn+1 and Cn+2 to fetch compared output signals Con−2, Con−1, Con, Con+1 and Con+2 from the comparators Cn−2, Cn−1, Cn, Cn+1 and Cn+2 for encoding the compared output signals Con−2, Con−1, Con, Con+1 and Con+2 into digital signals Do0 and Do1.

Each of the comparators Cn−2, Cn−1, Cn, Cn+1 and Cn+2 has the same circuit configuration as that described in the first embodiment with reference to FIG. 8A. The description of the circuit configuration of each of the comparators Cn−2, Cn−1, Cn, Cn+1 and Cn+2 are the same as made in the first embodiment. The operations of each of the comparators Cn−2, Cn−1, Cn, Cn+1 and Cn+2 are the same as those described in the first embodiment with reference to FIG. 8B.

The encoder has the same circuit configuration as that described in the first embodiment with reference to FIG. 9. The description of the circuit configuration of the encoder is the same as made in the first embodiment. The operations of the encoder are the same as those described in the first embodiment with reference to TABLE OF TRUTH VALUE.

The operations of the analog-to-digital circuit described above are the same as those described in the first embodiment with reference to FIG. 7.

The above described analog-to-digital converter is free from the problems of the conventional analog-to-digital converter described above. If the sampling period is terminated and it enters into the comparison period and thereby the voltages of the nodes "A" and "B" are changed from the threshold voltage Vth into either the high or low level, the first and second invertors INV1 and INV2 show properties of output voltage "Vout" and punch through currents Idd as illustrated in FIG. 10. The output voltage Vout is rapidly dropped from the voltage Vdd to the zero voltage when the input voltage Vin is leveled around the threshold voltage Vth. The punch through voltage Idd has a sharp peak at the threshold voltage Vth as the input voltage Vin. The punch through current Idd means a current flowing from the power supply line through the second n-channel and second p-channel MOS field effect transistors N2 and P2 to the ground line GND. The rapid drop of the punch through current Idd causes noises of the power supply line and the ground line.

In any one of the comparators Cn−2, Cn−1, Cn, Cn+1 and Cn+2, if the input side of the invertor provided is applied with a voltage in the vicinity of the threshold voltage Vth, then a difference between the analog input voltage Ain and the reference voltage Vrn is extremely small, for which reason slight fluctuations on the input signals of the comparator causes a large variation in output voltage of the comparator as well as a large variation in punch through voltage thereof. This means that the one of the first, second and third comparators C0, C1 and C2 is likely to receive a large efficiency of the noise. Further, that means that the one of the comparators Cn−2, Cn−1, Cn, Cn+1 and Cn+2 is placed in a state where noises are likely to appear on the corresponding power supply line and the corresponding ground line due to the rapid variation in the punch through current Idd of the invertor.

Even if the comparator Cn is placed in an unstable state where noises are likely to appear and the comparator is likely to be affected by the noises, since the comparators Cn−1 and Cn−2 are connected to the first power supply line Vo0 and the first ground line Go1, any interference could never appear through the noise on the second power supply line Vo1 and the second ground line Go1 whereby it may be impossible that both the output signals of the decoder are at the low level "0" by error. More precisely, the output signal could never be at the low level "0" by error. This means the improved analog-to-digital converter has an accurate conversion performance free from any error and then has a certain reliability on accuracy of the output digital signals.

The above descriptions prove that the improved analog-to-digital converter in accordance with the present invention is capable of preventing any interference of the comparator which is inputted with the analog input signal slightly different from the reference voltage to obtain a high accuracy of the conversion operation free of any error on output signal.

Whereas modifications of the present invention will no doubt be apparent to a person having ordinary skill in the art, to which the invention pertains, it is understood that embodiments as shown and described by way of illustrations are by no means intended to be considered in a limiting sense. Accordingly, it is to be intended to cover by claims all modifications which fall within the spirit and scope of the present invention.

What is claimed is:

1. An analog-to-digital converter comprising:
 a reference voltage generation circuit for dividing a reference voltage into a plurality of divided reference voltages having voltage levels different from each other;
 a first pair of a first power supply line and a first ground line;
 a second pair of a second power supply line and a second ground line, said second power supply line being separated from said first power supply line, and said second ground line being separated from said first ground line;
 a plurality of comparators, each of which has a first input terminal connected to an analog input line for fetching analog signals and a second input terminal connected to said reference voltage generation circuit for fetching a corresponding one of said divided reference voltages so as to compare said analog signals with said divided reference voltage, said each of said comparators having an output terminal through which a compared digital signal is outputted; and
 a decoder circuit connected to said output terminals of said comparators for fetching said compared digital signals and decoding said compared digital signals, wherein said comparators are alternately connected to said first pair of said first power supply line and said first ground line and said second pair of said second power supply line and said second ground line so that no interference between said different power supply lines and between said different ground lines appears through any noise generated on any of said comparators.

2. An analog-to-digital converter comprising:

means for dividing a reference voltage into a plurality of divided reference voltages having voltage levels different from each other;

a first pair of a first power supply line and a first ground line;

a second pair of a second power supply line and a second ground line, said second power supply line being separated from said first power supply line, and said second ground line being separated from said first ground line;

a plurality of comparators, each of which has a first input terminal connected to an analog input line for fetching analog signals and a second input terminal connected to said dividing means for fetching a corresponding one of said divided reference voltages so as to compare said analog signals with said divided reference voltage, said each of said comparators having an output terminal through which a compared digital signal is outputted; and means being connected to said output terminals of said comparators for fetching said compared digital signals from said comparators and decoding said compared digital signals.

wherein said comparators are alternately connected to said first pair of said first power supply line and said first ground line and said second pair of said second power supply line and said second ground line so that no interference between said different power supply lines and between said different ground lines appears through any noise generated on any of said comparators.

* * * * *